US012587157B2

(12) United States Patent (10) Patent No.: US 12,587,157 B2

Furukawa (45) Date of Patent: Mar. 24, 2026

(54) NOISE REMOVAL FILTER

(71) Applicant: TOYOTA JIDOSHA KABUSHIKI KAISHA, Aichi-ken (JP)

(72) Inventor: Tatsuya Furukawa, Toyota (JP)

(73) Assignee: TOYOTA JIDOSHA KABUSHIKI KAISHA, Aichi-Ken (JP)

( * ) Notice: Subject to any disclaimer, the term of this patent is extended or adjusted under 35 U.S.C. 154(b) by 106 days.

(21) Appl. No.: 18/626,336

(22) Filed: Apr. 4, 2024

(65) Prior Publication Data

US 2024/0339983 A1 Oct. 10, 2024

(30) Foreign Application Priority Data

Apr. 7, 2023 (JP) ................................. 2023-063062

(51) Int. Cl.
　　*H03H 7/01* (2006.01)
　　*H02G 5/02* (2006.01)
　　*H03H 1/00* (2006.01)

(52) U.S. Cl.
　　CPC ............ *H03H 7/0153* (2013.01); *H02G 5/02* (2013.01); *H03H 7/0115* (2013.01); *H03H 1/0007* (2013.01)

(58) Field of Classification Search
　　CPC ... H03H 7/0153; H03H 7/0115; H03H 1/0007

USPC .......................................... 333/175, 181, 185
See application file for complete search history.

(56) References Cited

U.S. PATENT DOCUMENTS

| 11,621,632 B2 * | 4/2023 | Beck ...................... H02M 7/003 |
| | | 333/185 |
| 2014/0326499 A1 * | 11/2014 | Ohashi ...................... H03H 7/01 |
| | | 174/70 B |

FOREIGN PATENT DOCUMENTS

JP 2022-126250 A 8/2022

* cited by examiner

*Primary Examiner* — Rakesh B Patel
(74) *Attorney, Agent, or Firm* — HAUPTMAN HAM, LLP

(57) ABSTRACT

A noise removal filter for removing noise propagated through a plurality of bus bars to which an output of an electric-power control device is to be supplied. The noise removal filter includes: an annular inductance attached to the plurality of bus bars that are inserted through the annular inductance; and a capacitor unit including a capacitor having a terminal electrically connected to surfaces of the plurality of bus bars and another terminal electrically connected to a reference potential. The inductance and the capacitor unit are attached to the plurality of bus bars in variable positions.

4 Claims, 6 Drawing Sheets

NOISE REMOVAL FILTER

This application claims priority from Japanese Patent Application No. 2023-063062 filed on Apr. 7, 2023, the disclosure of which is herein incorporated by reference in its entirety.

FIELD OF THE INVENTION

The present invention relates to a noise removal filter for removing noise propagated from an electric-power control device.

BACKGROUND OF THE INVENTION

A noise removal filter for removing noise propagated from an electric-power control device is known. For example, Patent Document 1 discloses such a noise removal filter.

PRIOR ART DOCUMENT

Patent Document

[Patent Document 1]
Japanese Patent Application Laid-Open No. 2022-126250

SUMMARY OF THE INVENTION

The noise removal filter disclosed in Patent Document 1 has a filter configuration in which a connection relationship between an inductance and a capacitor is predetermined. That is, it is difficult to change the filter configuration to a different filter configuration in accordance with so-called electromagnetic compatibility (EMC) noise, i.e., noise generated by the electric-power control device. Therefore, it is necessary to prepare different components for different filter configurations.

The present invention has been made in view of the above circumstances, and an object of the present invention is to provide a noise removal filter that can use common components for different filter configurations.

The present invention provides a noise removal filter for removing noise propagated through a plurality of bus bars to which an output of an electric-power control device is to be supplied. The noise removal filter includes: an annular inductance attached to the plurality of bus bars that are inserted through the annular inductance; and a capacitor unit including a capacitor having a terminal electrically connected to surfaces of the plurality of bus bars and another terminal electrically connected to a reference potential. The inductance and the capacitor unit are attached to the plurality of bus bars in variable positions.

The noise removal filter of the present invention includes the annular inductance attached to the plurality of bus bars that are inserted through the annular inductance, and the capacitor unit including the capacitor having the terminal electrically connected to the surfaces of the plurality of bus bars and another terminal electrically connected to the reference potential, wherein the inductance and the capacitor unit are attached to the plurality of bus bars in the variable positions, namely, the attached positions in which the inductance and the capacitor unit are attached to the plurality of bus bars are variable. In such a construction, the attached positions in which the annular inductance and the capacitor unit are attached to the plurality of bus bars can be easily variable or changed. The change of the attached positions of the annular inductance and the capacitor unit results in change of the filter configuration. Thus, it is possible to provide a noise removal filter in which its components or members can be shared even in different filter configurations.

DETAILED DESCRIPTION OF PREFERRED EMBODIMENT

Figure 1:
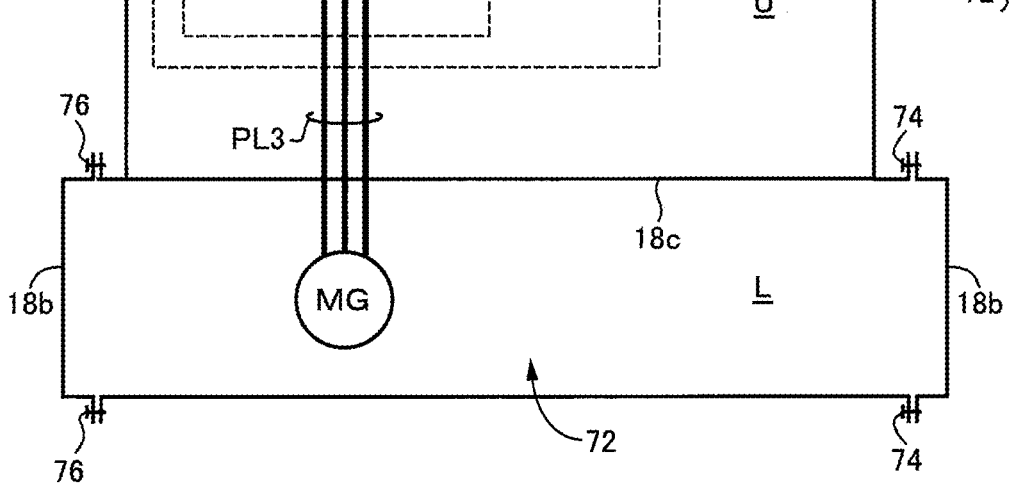
FIG. 1 is a view showing, by way of example, an electrical configuration of an electric-power control device and the like in a vehicle in which a noise removal filter according to an embodiment of the present invention is provided.

Hereinafter, an embodiment of the present invention will be described in detail with reference to the drawings. In the drawings of the embodiment, the drawings are simplified or modified as appropriate, and the dimensional ratios, shapes, and the like of components or parts are not necessarily accurately described.

Embodiment

FIG. 1 is a view showing, by way of example, an electrical configuration of an electric-power control device 54 and the like in a vehicle 10 in which a noise removal filter 30 (hereinafter, simply referred to as "filter 30") according to an embodiment of the present invention is provided.

The vehicle 10 is an electric vehicle including an electric motor MG that functions as a power source. The electric motor MG is, for example, a rotary electric machine having an electric motor function and a generator function, and is a so-called motor generator. The electric motor MG is, for example, a three-phase synchronous electric motor. The electric motor MG is connected to a pair of drive wheels (not shown) so as to transmit power.

The vehicle 10 includes a high-voltage battery 46, an auxiliary battery 48, and the electric-power control device 54.

The high-voltage battery 46 is a chargeable and dischargeable secondary battery such as a nickel-hydrogen secondary battery or a lithium ion battery. The high-voltage battery 46 is connected to the electric-power control device 54 via first power lines PL1. The first power lines PL1 are power lines through which a direct current flows, and accordingly consist of two power lines. The high-voltage battery 46 is a battery for driving the electric motor MG. For example, the stored electric power is supplied from the high-voltage battery 46 to the electric motor MG via the electric-power control device 54. The electric motor MG generates electric power by using a driven force inputted from the pair of drive wheels, and the generated electric power is charged in the high-voltage battery 46 via the electric-power control device 54.

The auxiliary battery 48 is a chargeable and dischargeable secondary battery such as a lead storage battery. The auxiliary battery 48 has a charging voltage lower than that of the high-voltage battery 46. The auxiliary battery 48 is connected to the electric-power control device 54 via second power lines PL2, a DC-DC converter 56 (described later) and the first power lines PL1. The second power lines PL2 are power lines through which a direct current flows, and accordingly consist of two power lines. The auxiliary battery 48 is charged with electric power generated by an alternator (not shown) or electric power supplied from the high-voltage battery 46 via the first power lines PL1, the DC-DC converter 56 and the second power lines PL2.

The electric-power control device 54 controls driving of the electric motor MG. The electric-power control device 54 includes the DC-DC converter 56, a boost converter 60, an inverter 62 and a motor control device 58. The electric-power control device 54 is an electric-power control device that controls electric power exchanged between the high-voltage battery 46 and the electric motor MG, that is, electric power received and supplied by the electric motor MG.

The DC-DC converter 56 is provided between the first power lines PL1 and the second power lines PL2. The DC-DC converter 56 functions as a charging device that reduces the voltage of the high-voltage battery 46 to a voltage equivalent to that of the auxiliary battery 48 and charges the auxiliary battery 48. The auxiliary battery 48 supplies electric power for operating auxiliary devices provided in the vehicle 10. The auxiliary battery 48 supplies electric power for operating, for example, the auxiliary devices and the motor control device 58.

The boost converter 60 includes a reactor and a switching element (not shown). The boost converter 60 is a voltage step-up/down circuit having a function of increasing the voltage of the high-voltage battery 46 and supplying the increased voltage to the inverter 62, and a function of reducing the voltage converted into a direct current by the inverter 62 and supplying the reduced voltage to the high-voltage battery 46.

The inverter 62 includes an MG power module 64. The MG power module 64 includes a switching element (not shown). The MG power module 64 is connected to the motor MG via third power lines PL3. The third power lines PL3 are three power lines through which a three-phase alternating current of, for example, U phase, V phase and W phase flows. The inverter 62 converts the direct current outputted from the boost converter 60 into an alternating current for driving the electric motor MG. The inverter 62 converts the alternating current generated by the electric motor MG into a direct current.

An electronic control device 50 supplies and receives signals to and from the DC-DC converter 56 and the motor control device 58 via, for example, a known controller area network (CAN) communication line. The electronic control device 50 controls the driving of the motor MG based on signals supplied from sensors (not shown), for example, so as to control a running state of the hybrid vehicle 10. The electronic control device 50 controls, for example, the DC-DC converter 56 to reduce the voltage of the high-voltage battery 46 to a voltage equivalent to that of the auxiliary battery 48. In the present embodiment, the electronic control device 50 is a control device that is other than the electric-power control device 54, particularly, the motor control device 58.

The motor control device 58 controls the motor MG based on the power demand value supplied from the electronic control device 50. For example, the motor control device 58 controls the boost converter 60 and the inverter 62 so as to control output of the motor MG.

A casing 18, which is a non-rotatable member attached to a body of the vehicle 10, is made of, for example, a cast aluminum alloy. The casing 18 is set to a reference potential of the electrical configuration such as the electric-power control device 54 in the vehicle 10. The "reference potential" is a potential serving as a reference of a circuit including an electronic circuit. To be specific, the reference potential is a reference (0 [V]) of the potentials of the electric-power control device 54, the high-voltage battery 46, the auxiliary battery 48, the electric motor MG, the electronic control device 50 and the like. The casing 18 is formed by integrally connecting a plurality of members by fasteners such as bolts 74, 76, 78. An inside of the casing 18 is divided into upper and lower portions in a vertical direction by a partition wall 18*c*. The casing 18 has an upper space U and a lower space L which are separated from each other in the vertical direction by the partition wall 18*c*. A sidewall of the casing 18 that defines the upper space U is a sidewall 18*a*, and another sidewall of the casing 18 that defines the lower space L is a sidewall 18*b*. The partition wall 18*c* is a partition provided to define a lower end of the upper space U and also an upper end of the lower space L. Therefore, when the upper space U and the lower space L are separated from each other in the casing 18, at least one of the upper space U and the lower space L is necessarily exposed to an outside of the casing 18. The "same casing" means a casing in which at least one of the upper space U and the lower space L is exposed to the outside when the upper space U and the lower space L are separated from each other as described above.

In a state in which the electric-power control device 54 is mounted on the vehicle 10, the electric-power control device 54 is accommodated in the upper space U, and a transaxle 72 including the electric motor MG is accommodated in the lower space L. In this way, the transaxle 72 and the electric-power control device 54 are accommodated in the same casing 18.

The filter 30 is attached to, for example, bus bars 80 that are parts of the first power lines PL1. The bus bars 80 is connection lines provided on a connection block that connects between the inside and outside of the casing 18 (to be specific, the inside and outside of the upper space U) in the first power lines PL1, for example.

In the electric-power control device 54, for example, when switching elements included in the boost converter 60 and the inverter 62 are controlled to be switched at high speed, noise of a high-frequency component is generated. This noise is propagated as common mode noise to the high-voltage battery 46 via the bus bars 80 of the first power lines PL1, for example.

Figure 2A:
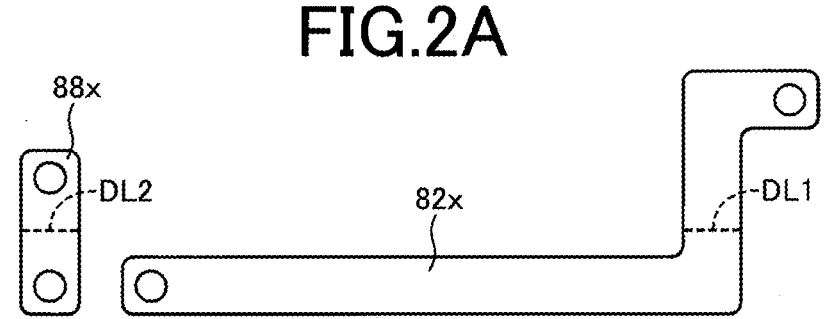
FIG. 2A is a view for explaining a method of manufacturing a bus bar.
Figure 2B:
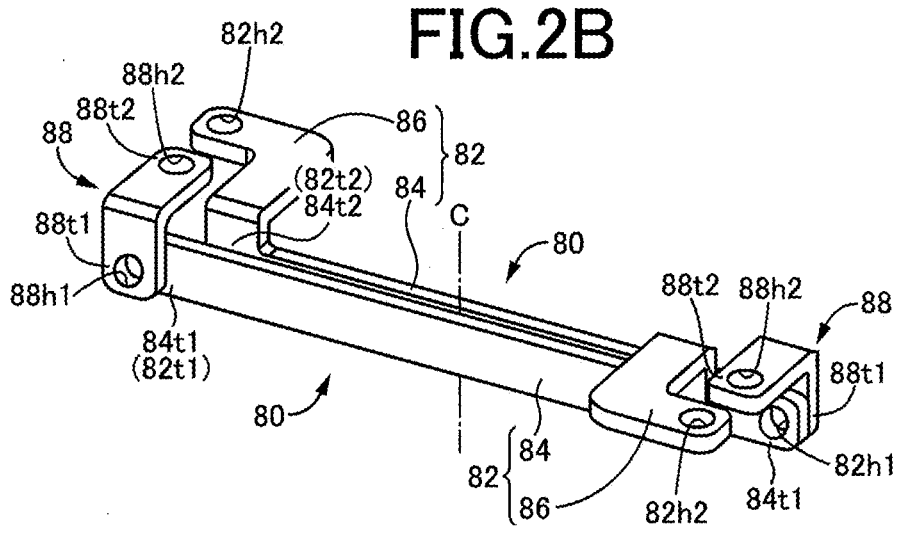
FIG. 2B is a perspective view of two bus bars in a state in which the two bus bars are provided in a vehicle.

FIG. 2A is a view for explaining a method of manufacturing the bus bar 80. FIG. 2B is a perspective view of the two bus bars 80 in a state in which the two bus bars 80 are provided in the vehicle 10. Each of the bus bars 80 has conductivity and is made of, for example, metal. The two bus bars 80 correspond to "plurality of bus bars" in the present invention.

A method of manufacturing the bus bars 80 will be described with reference to FIG. 2A. First, plate-shaped bodies 82*x*, 88*x* shown in FIG. 2A, which are formed by, for example, punching or cutting in press working, are prepared. FIG. 2A is a view of each of the plate-shaped bodies 82*x*, 88*x* as viewed in its plate thickness direction. Next, the plate-shaped body 82x is bent by 90° with broken line DL1 being on an inner side. The broken line DL1 is the same as a longitudinal direction of a straight linear portion 84 described later. In a cross-sectional view perpendicular to the broken line DL1, a portion in which the plate-shaped body 82x is bent is L-shaped. Further, the plate-shaped body 88x is bent by 90° with broken line DL2 being on an outer side. The broken line DL2 is the same as the longitudinal direction of the straight linear portion 84 described later. In a cross-sectional view perpendicular to the broken line DL2, a portion in which the plate-shaped body 88x is bent is L-shaped. Each of the bus bars 80 is formed by combining the plate-shaped bodies 82x, 88x which are bent in this manner.

As shown in FIG. 2B, the two bus bars 80 are, for example, line-symmetrical with respect to straight line C in a state in which the two bus bars 80 are mounted on the vehicle 10. There is a gap between the two bus bars 80, and the two bus bars 80 are insulated from each other. Each of the two bus bars 80, which are separate members separated from each other, includes a main member 82 and a connecting member 88, such that the main member 82 includes the straight linear portion 84 extending linearly, and such that the connecting member 88 is connected to an end portion 84t1 of the straight linear portion 84 in a longitudinal direction of the straight linear portion 84 and extends in a direction different from the longitudinal direction of the straight linear portion 84.

The end portion 84t1 of the straight linear portion 84 is also an end portion 82t1 of the main member 82 in the longitudinal direction. Another end portion 82t2 of the main member 82 opposite to the end portion 82t1 in the longitudinal direction is a bent portion 86. The bent portion 86 is a portion extending further outwardly from another end portion 84t2 of the straight linear portion 84, which is opposite to the end portion 84t1 in the longitudinal direction. The term "outwardly" refers to a direction away from the straight linear portion 84 in the longitudinal direction. The bent portion 86 includes a portion extending in a direction that is different from the longitudinal direction of the straight linear portion 84. To be more specific, the bent portion 86 extends outwardly from the other end portion 84t2 of the straight linear portion 84, is bent by 90° with respect to the longitudinal direction of the straight linear portion 84 without changing the plate thickness direction, is then bent toward a direction away from the other bus bar 80 with the plate thickness direction being changed by 90°, and is further bent outwardly in the same direction as the longitudinal direction of the straight linear portion 84 without changing the plate thickness direction. The straight linear portion 84 corresponds to "extending portion" in the present invention. The end portion 84t1 corresponds to "end portion" in the present invention, and the other end portion 84t2 corresponds to "another end portion" in the present invention.

The straight linear portion 84 has a plate shape extending linearly. A hole 82h1 is provided in the end portion 84t1 of the straight linear portion 84. The hole 82h1 is a hole for connecting with the connecting member 88 by a bolt (not shown). A hole 82h2 is provided in the other end portion 82t2 of the main member 82.

The connecting member 88 is formed by bending a plate-like body by 90° with respect to its longitudinal direction. A hole 88h1 is provided in an end portion 88t1 of the connecting member 88, and a hole 88h2 is provided in another end portion 88t2 of the connecting member 88. The hole 88h1 of the connecting member 88 is a hole for connecting with the main member 82 by a bolt (not shown). The main member 82 and the connecting member 88 are connected to each other by the bolt (not shown) inserted through the hole 82h1 provided in the end portion 82t1 of the main member 82 and the hole 88h1 provided in the end portion 88t1 of the connecting member 88. The hole 82h2 provided in the other end portion 82t2 of the main member 82 and the hole 88h2 provided in the other end portion 88t2 of the connecting member 88 are holes for connecting the bus bars 80 to, for example, the first power lines PL1 inside the casing 18 or the first power lines PL1 outside the casing 18, by bolts (not shown).

Figure 3:
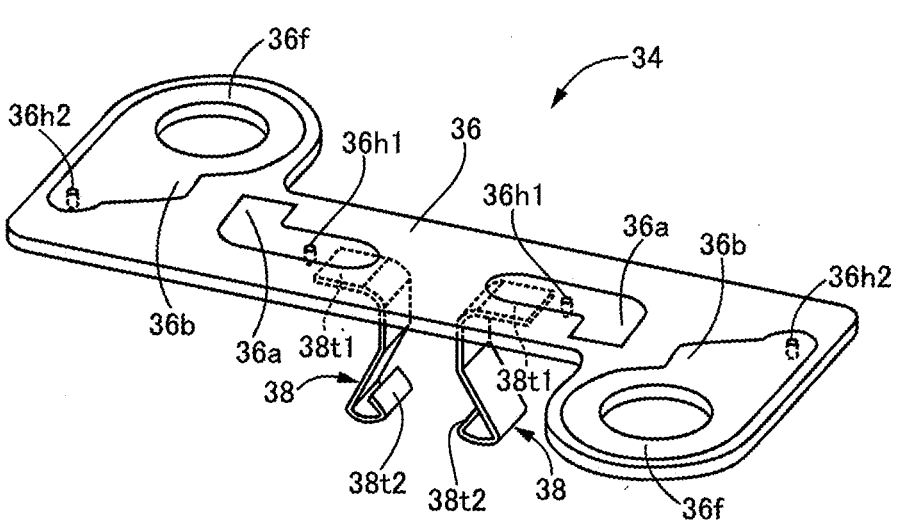
FIG. 3 is a perspective view for explaining a construction of a capacitor unit.

FIG. 3 is a perspective view for explaining a construction of the capacitor unit 34. In FIG. 3, a first capacitor 90 and a second capacitor 92, which will be described later, are not shown.

The capacitor unit 34 includes a substrate portion 36 and plate springs 38.

Two pairs of first and second conductive portions 36a, 36b are provided on a surface of the substrate portion 36. The first conductive portions 36a are provided with through-holes 36h1, respectively, and the second conductive portions 36b are provided with through-holes 36h2, respectively. The first capacitor 90 (see FIG. 4) is mounted between each of the two pairs of the first and second conductive portions 36a, 36b by, for example, soldering. The second capacitor 92 (see FIG. 4) is mounted between each of the two pairs of the first and second conductive portions 36a, 36b via the through-holes 36h1, 36h2, for example, by soldering. Preferably, the first and second capacitors 90, 92 are capacitors having different electrical characteristics. For example, the first capacitor 90 has a frequency characteristic that is less likely to propagate high-frequency noise than the second capacitor 92, and the second capacitor 92 has a larger capacitance than the first capacitor 90. Each of the first and second capacitors 90, 92 corresponds to "capacitor" in the present invention.

The substrate portion 36 has two attachment portions 36f electrically connected to the respective second conduction portions 36b. Each of the attachment portions 36f is provided with a fastening hole. The substrate portion 36 is fastened to the casing 18 at the attachment portions 36f by bolts 40 (see FIG. 4). To be specific, the capacitor unit 34 is fastened to the casing 18 by bolts 40 inserted through the fastening holes provided in the attachment portions 36f. A part of each of the bolts 40 is in electrical contact with the second conductive portion 36b. That is, the second conductive portions 36b are electrically connected to the casing 18 via the bolts 40.

The capacitor unit 34 includes the two plate springs 38. Each of the two plate springs 38 has opposite end portions 38t1, 38t2, wherein an end portion 38t1 as one of the opposite end portions 38t1, 38t2 is attached to the base plate portion 36 and is electrically connected to the first conductive portion 36a, and wherein another end portion 38t2 as another one of the opposite end portions 38t1, 38t2 can be brought into contact with a surface of the straight linear portion 84 of the bus bar 80. The plate springs 38 are electrically conductive and are made of, for example, metal. The other end portion 38t2 of each of the plate springs 38 has a spring structure that presses the surface of the straight linear portion 84 of the bus bar 80 by a biasing force. When the filter 30 is attached to the two bus bars 80, the two plate springs 38 are able to hold the bus bars 80 electrically connected to the surfaces thereof.

Figure 4:
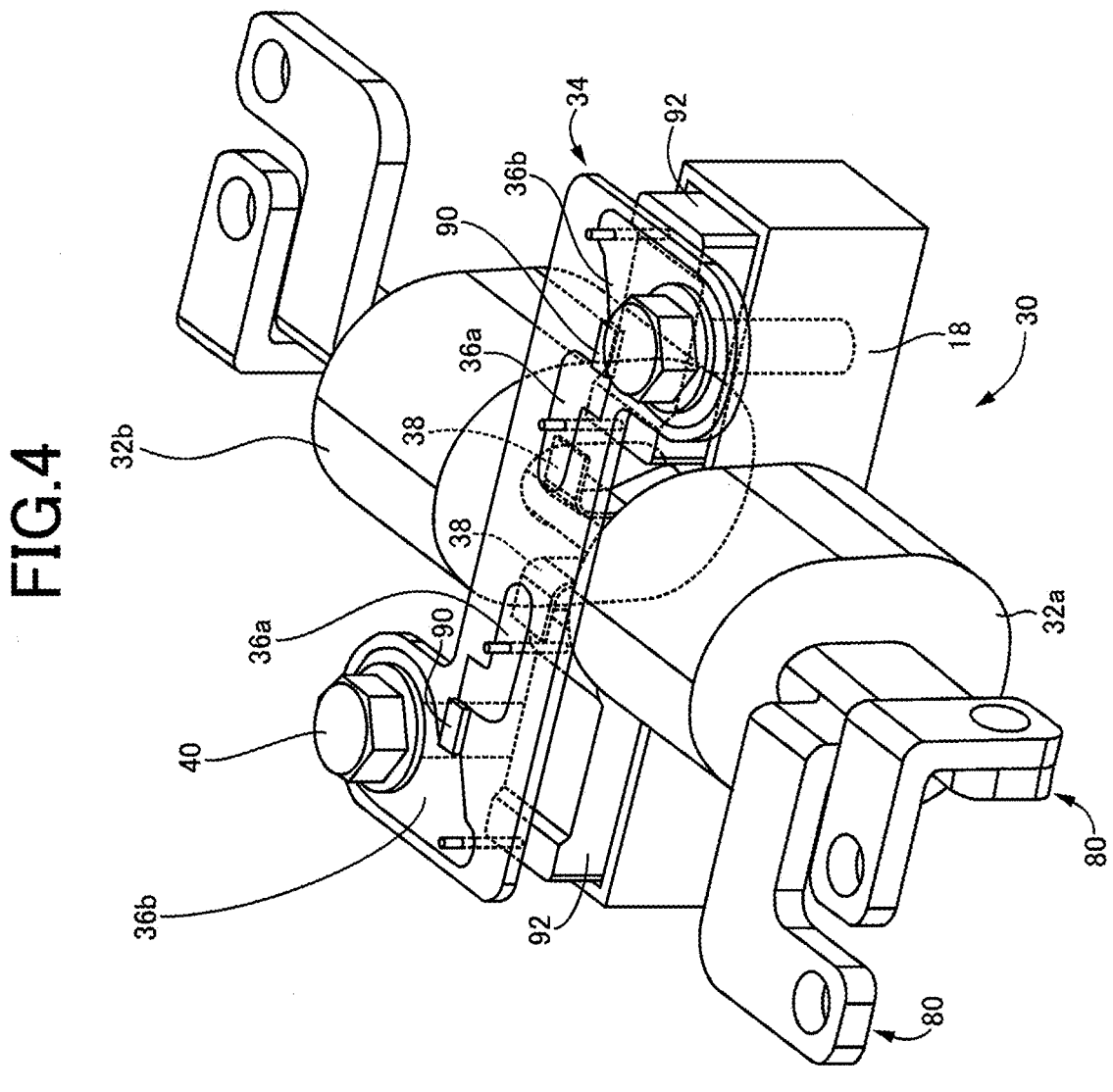
FIG. 4 is a perspective view of the noise removal filter attached to the two bus bars.

FIG. 4 is a perspective view of the filter 30 attached to the two bus bars 80. The filter 30 is a noise removal filter that is configured to remove noise propagated through the bus bars 80. The filter 30 includes a ferrite core 32*a*, a ferrite core 32*b*, and the capacitor unit 34.

Each of the ferrite cores 32*a*, 32*b* is a non-split-type annular ferrite core into which the two bus bars 80 are inserted and attached. The ferrite cores 32*a*, 32*b* have surfaces that are covered with an insulating material. In the ferrite core, the "split-type" means a structure in which the annular ferrite core can be detachably split or combined with the bus bar, and the "non-split type" means a structure in which the annular ferrite core cannot be split and is integrated. Each of the ferrite cores 32*a*, 32*b* corresponds to "inductance" in the present invention.

The filter 30 is attached to the two bus bars 80, for example, in the following procedure. First, in one of the two bus bars 80, the end portion 82*t*1 of the main member 82 is inserted through the ferrite cores 32*a*, 32*b* in this order, and then the connecting member 88 is connected to the end portion 82*t*1 of the main member 82. In the other of the two bus bars 80, after the end portion 82*t*1 of the main member 82 is inserted through the ferrite cores 32*b*, 32*a* in this order, the connecting member 88 is connected to the end portion 82*t*1 of the main member 82. Next, the capacitor unit 34 is attached to the bus bars 80 between the ferrite cores 32*a*, 32*b* in the longitudinal direction of the straight linear portions 84 of the two bus bars 80. The capacitor unit 34 is attached such that the other end portions 38*t*2 of the two plate springs 38 are electrically connected to the surfaces of the two bus bars 80. Next, the substrate portion 36 of the capacitor unit 34 is fastened to the casing 18 by the bolts 40.

Preferably, in a cross section perpendicular to the longitudinal direction of the straight linear portion 84, a polygon defined by outer edge portions of the two bus bars 80 as a whole is inscribed in inner peripheries of the ferrite cores 32*a*, 32*b*. This reduces amount of clearance between the ferrite cores 32*a*, 32*b* and the two bus bars 80.

The ferrite cores 32*a*, 32*b* and the capacitor unit 34 are attached to the two bus bars 80 in variable positions. Namely, the attached positions in which the ferrite cores 32*a*, 32*b* and the capacitor unit 34 are attached to the two bus bars 80 are variable. The expression "the attached positions are variable" means that the ferrite cores 32*a*, 32*b* and the capacitor unit 34 can be mounted on the two bus bars 80 by changing a connection relationship between the ferrite cores 32*a*, 32*b* and the capacitor unit 34.

Figure 5:
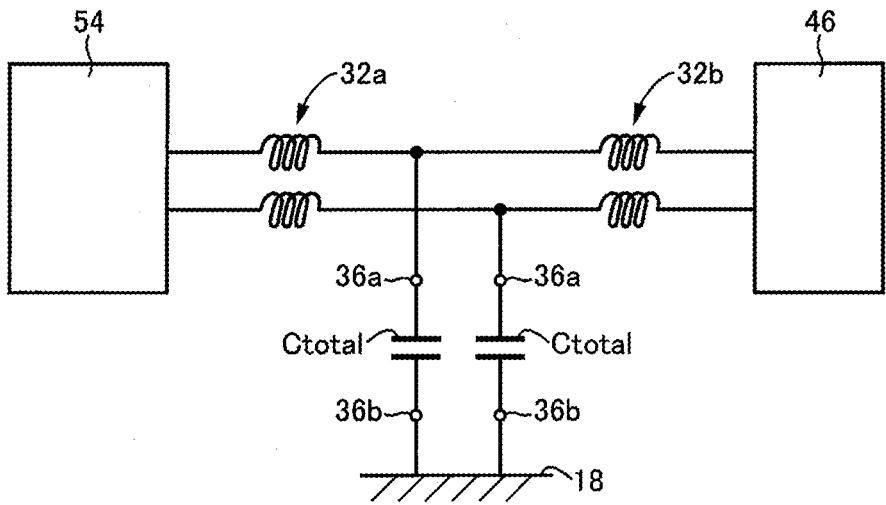
FIG. 5 is a view for explaining a filter configuration of the noise removal filter shown in FIG. 4.

FIG. 5 is a view for explaining a filter configuration of the filter 30 shown in FIG. 4.

Each of the ferrite core 32*a* and the ferrite core 32*b* functions as an inductance, which is substantially the same as an arrangement in which each of the two bus bars 80 is inserted into a coil. The first and second capacitors 90, 92 mounted on the capacitor unit 34 are connected in parallel between each of the two bus bars 80 and the casing 18 that is set to the reference potential. In FIG. 5 showing the filter configuration of the filter 30, "Ctotal" [μF] represents an electrostatic capacity that is a sum of an electrostatic capacity C1 [μF] of the first capacitor 90 and an electrostatic capacity C2 [μF] of the second capacitor 92.

Figure 6A:
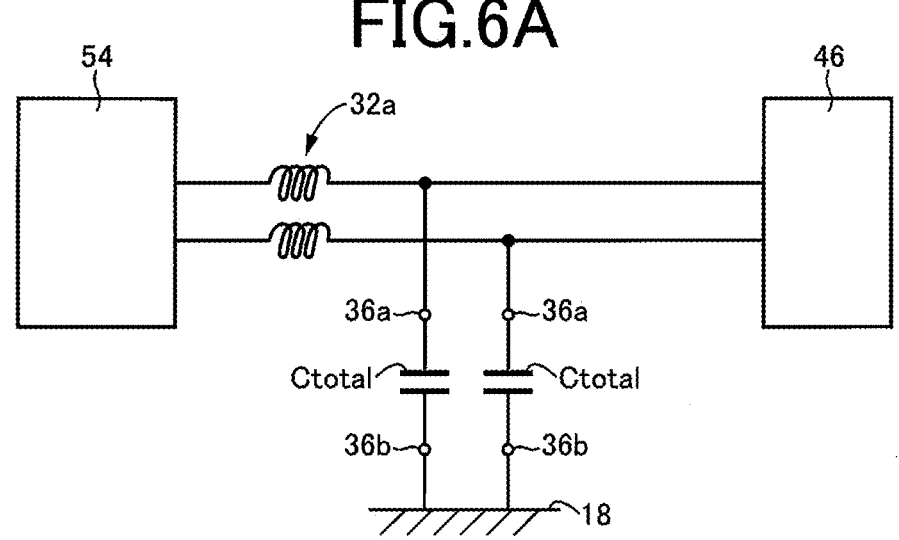
FIGS. 6A, 6B, 6C are modifications of the filter configuration of the noise removal filter shown in FIG. 4.
Figure 6B:
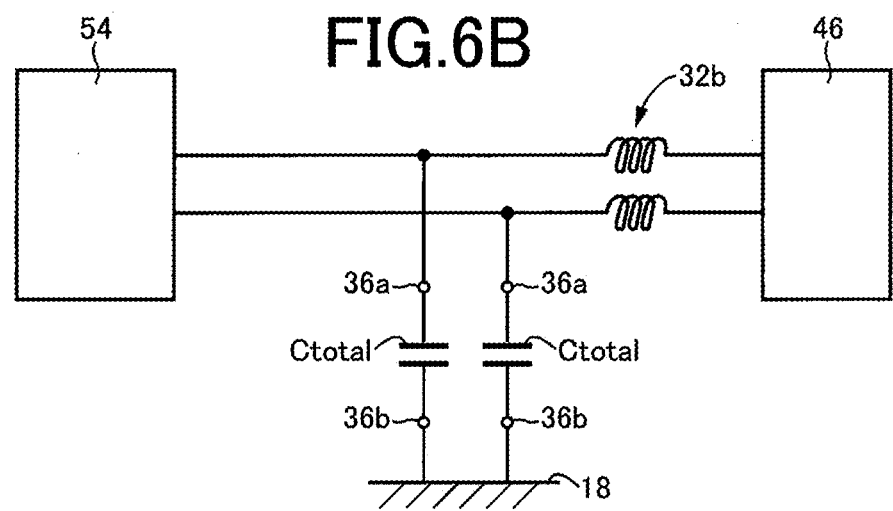
Figure 6C:
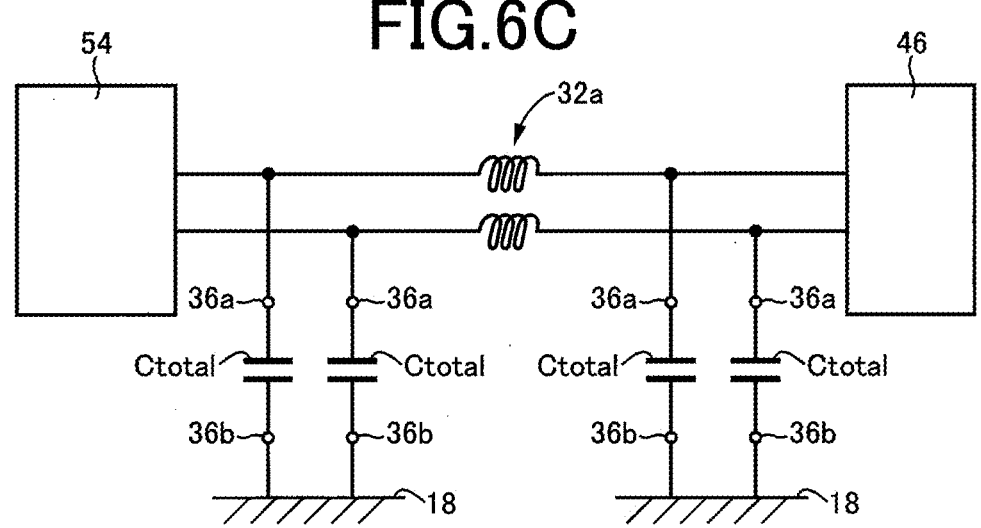

FIGS. 6A, 6B, 6C are modifications of the filter configuration of the filter 30 shown in FIG. 4.

FIG. 6A shows a first modification of the filter configuration in which the filter 30 other than the ferrite core 32*b* is attached to the bus bars 80.

FIG. 6B shows a second modification of the filter configuration in which the filter 30 other than the ferrite core 32*a* is attached to the bus bars 80.

FIG. 6C shows a third modification of the filter configuration in which two capacitor units 34 are attached to the bus bars 80 and one ferrite core 32*a* is attached by inserting the straight linear portions 84 of the two bus bars 80 between the two capacitor units 34.

According to the present embodiment, the annular ferrite cores 32*a*, 32*b* into which the two bus bars 80 are inserted and attached and the capacitor unit 34 having the first and second capacitors 90, 92 each having the terminal electrically connected to the surface of a corresponding one of the two bus bars 80 and the other terminal electrically connected to the casing 18 are provided, wherein the ferrite cores 32*a*, 32*b* and the capacitor unit 34 are attached to the bus bars 80 in the variable positions, namely, the attached positions in which the ferrite cores 32*a*, 32*b* and the capacitor unit 34 are attached to the bus bars 80 are variable. In this way, the attached positions in which the annular ferrite cores 32*a*, 32*b* and the capacitor unit 34 are attached to the two bus bars 80 can be easily changed. The change in the attached positions of the annular ferrite cores 32*a*, 32*b* and the capacitor unit 34 is a change in the filter configuration. In this way, the filter 30 can be provided in which the components (i.e., the annular ferrite cores 32*a*, 32*b* and the capacitor unit 34) can be shared even in different filter configurations.

According to the present embodiment, each of the two bus bars 80 includes the main member 82 including the straight linear portion 84 extending linearly, and the connecting member 88 connected to the end portion 84*t*1 of the straight linear portion 84. With such a structure, the two bus bars 80 can be inserted into the non-split annular ferrite cores 32*a*, 32*b* from side of the end portion 84*t*1 of the straight linear portion 84. Where each of the ferrite cores 32*a*, 32*b* is of non-split type, a filter configuration can be obtained which has a simple structure, is low in cost, and has stable impedance characteristics, as compared with the case of split type.

According to the present embodiment, each of the two bus bars 80 has the bent portion 86, and the bent portion 86 extends further outwardly from the other end portion 84*t*2 of the straight linear portion 84 and includes the portion extending in the direction different from the longitudinal direction of the straight linear portion 84. By providing the bent portion 86, a degree of design freedom of the shape of the other end portion 82*t*2 of the main member 82 in the bus bar 80 is improved as compared to a case in which the bent portion 86 is not provided. This makes it possible to insert the two bus bars 80 into the ferrite cores 32*a*, 32*b* and to secure an insulating distance between the two bus bars 80.

According to the present embodiment, the two bus bars 80 are held by the two conductive plate springs 38 provided in the capacitor unit 34, and the surfaces of the two bus bars 80 are electrically connected to terminals of both the first and second capacitors 90, 92 via the plate springs 38. Since the plate spring 38 holds the bus bars 80, movement of the bus bars 80 relative to the plate springs 38 is suppressed. This stabilizes conductivity between the plate springs 38 and the bus bars 80, and thus stabilizes noise removal characteristics of the filter 30.

According to the present embodiment, the capacitor unit 34 has the first conductive portion 36*a* that is electrically connected to each of the two bus bars 80 and the second conductive portion 36*b* that is electrically connected to the casing 18, and the first capacitor 90 and the second capacitor 92 are mounted between the first conductive portion 36*a* and the second conductive portion 36*b*. The characteristics of the filter 30 can be changed in various ways by changing the electrical characteristics (specifically, the capacitance and the frequency characteristics) of the capacitor mounted on the capacitor unit 34.

According to the present embodiment, the capacitor unit 34 has the attachment portion 36*f* electrically connected to the second conductive portion 36*b*, and the attachment portion 36*f* is held in the reference potential and is attached to the casing 18 housing the electric-power control device 54 by the bolt 40. In this way, the bolt 40 has both a function of physically fixing the capacitor unit 34 to the casing 18 and a function of electrically connecting the second conductive portion 36*b* to the casing 18. This suppresses an increase in the size of the capacitor unit 34.

The present invention can be implemented in various forms with various modifications and improvements based on the knowledge of those skilled in the art without departing from the scope of the present invention.

In the above-described embodiment, the annular ferrite cores 32*a*, 32*b* are of the non-split type, but the present invention is not limited thereto, and the annular ferrite cores 32*a*, 32*b* may be of split type. Where the annular ferrite cores 32*a*, 32*b* are of the split type, the two bus bars 80 can be easily inserted even if each of the two bus bars 80 is not linear such as straight linear.

In the above-described embodiment, each of the annular ferrite cores 32*a*, 32*b* corresponds to "inductance" in the present invention, but the "inductance" is not limited to the ferrite core, and may be a coil such as an air-core coil.

In the above-described embodiment, the filter 30 includes the two annular ferrite cores 32*a*, 32*b* and the single capacitor unit 34. However, the present invention is not limited thereto. For example, as in the above-described first or second modification, a mode may be adopted in which single annular ferrite core and the single capacitor unit 34 are provided. For example, as in the above-described third modification, two capacitor units 34 and single annular ferrite core may be provided. The "noise removal filter" in the present invention may be any combination of the annular ferrite cores 32*a*, 32*b* and the capacitor unit 34, regardless of the number of the ferrite cores 32*a*, 32*b* and the capacitor unit 34.

In the above-described embodiment, each of the two bus bars 80 is constituted by two members, namely, the main member 82 and the connecting member 88 connected to the end portion 82*t*1 of the main member 82. However, the present invention is not limited thereto. For example, each of the two bus bars 80 may be constituted by three members, that is, a main member having only the straight linear portion 84 and two connecting members connected to respective opposite end portions of the main member in the longitudinal direction, respectively. In such a case, the connecting member connected to the other end portion of the main member in the longitudinal direction has, for example, the same shape as the bent portion 86 in the above-described embodiment, where being connected to the main member.

In the above-described embodiment, each of the two bus bars 80 includes the straight linear portion 84 extending linearly and straightly. However, the present invention is not limited thereto. For example, the "extending portion" in the present invention may not extend linearly, but may have a shape that is curved in an arc shape or bent at a sharp angle, that is, a shape that extends linearly. Even with such a shape, the two bus bars 80 can be inserted into the non-split annular ferrite cores 32*a*, 32*b* from the side of the end portion in the longitudinal direction of the "extending portion".

In the above-described embodiment, the two bus bars 80 cooperate to have a shape that is line-symmetrical to each other with respect to the straight line C, but the present invention is not limited thereto.

In the above-described embodiment, the other end portion 38*t*2 of the plate spring 38 has a spring structure in which the other end portion 3812 presses the surfaces of the straight linear portions 84 of the bus bars 80 by biasing force. However, the present invention is not limited thereto. For example, a metal plate-shaped body having no spring structure may be provided in the capacitor unit 34 instead of the plate spring 38, and the plate-shaped body may be welded to the surface of the straight linear portion 84 of the bus bar 80.

In the above-described embodiment, the capacitor unit 34 is provided with two capacitors consisting of the first capacitor 90 and the second capacitor 92. However, the present invention is not limited thereto. For example, only one of the first capacitor 90 and the second capacitor 92 may be provided in the capacitor unit 34. For example, three or more capacitors may be provided in capacitor unit 34. The shapes of the first conductive portion 36*a* and the second conductive portion 36*b* of the capacitor unit 34 are appropriately changed according to the number of capacitors to be provided.

In the above-described embodiment, the filter 30 is attached to the first power lines PL1 between the electric-power control device 54 and the high-voltage battery 46. However, the present invention is not limited thereto. For example, the filter 30 may be attached to the second power lines PL2 between the electric-power control device 54 and the auxiliary battery 48. For example, the filter 30 may be attached to the third power lines PL3 between the electric-power control device 54 and the electric motor MG. In this case, the number of the bus bars is three in correspondence with the three third power lines PL3 consisting of the three power lines.

In the above-described embodiment, the drive unit 70 is constructed such that the transaxle 72 and the electric-power control device 54 are housed in the same casing 18. However, the present invention is not limited thereto. For example, the present invention is also applicable to a mode in which the transaxle 72 and the electric-power control device 54 are housed in separate casings. In this case, a member that defines a space for housing the electric-power control device 54 corresponds to the "casing".

In the above-described embodiment, the electric motor MG is a so-called motor generator. However, for example, the electric motor MG may be a rotary electric machine having only one of an electric motor function and a generator function. The number of phases of the electric motor MG is not limited to three.

In the above-described embodiment, the transaxle 72 includes the electric motor MG as a single electric motor. However, the present invention is not limited thereto. The transaxle 72 may include two or more electric motors. In the above-described embodiment, the vehicle 10 is an electric vehicle including the electric motor MG as a power source. However, the present invention is not limited thereto. For example, the present invention is applicable to a vehicle having an engine and an electric motor MG as power sources, that is, a hybrid electric vehicle.

NOMENCLATURE OF ELEMENTS

30: noise removal filter
32*a*, 32*b*: ferrite core (inductance)
34: capacitor unit
38: plate spring
54: electric-power control device
80: bus bar
82: main member 84: straight linear portion (extending portion)

84*t*1: end portion

84*t*2: other end portion

86: bent portion

88: connecting member

90: first capacitor (capacitor)

92: second capacitor (capacitor)

What is claimed is:

1. A noise removal filter for removing noise propagated through a plurality of bus bars to which an output of an electric-power control device is to be supplied, the noise removal filter comprising:

an annular inductance attached to the plurality of bus bars that are inserted through the annular inductance; and a capacitor unit including a capacitor having a terminal electrically connected to surfaces of the plurality of bus bars and another terminal electrically connected to a reference potential, wherein the inductance and the capacitor unit are attached to the plurality of bus bars in variable positions, and each of the plurality of bus bars includes a main member and a connecting member, such that the main member includes an extending portion extending linearly, and such that the connecting member is connected to an end portion of the extending portion in a longitudinal direction of the extending portion.

2. The noise removal filter according to claim 1, wherein the plurality of bus bars are held by respective conductive plate springs provided in the capacitor unit, and the surfaces of the plurality of bus bars are electrically connected to the terminal of the capacitor via the respective plate springs.

3. The noise removal filter according to claim 1, wherein the extending portion extends in a straight line.

4. The noise removal filter according to claim 1, wherein each of the plurality of bus bars includes a bent portion, wherein the bent portion extends further outwardly from another end portion of the extending portion which is opposite to the end portion in the longitudinal direction of the extending portion, and wherein the bent portion includes a portion extending in a direction that is different from the longitudinal direction of the extending portion.

\* \* \* \* \*